(12) United States Patent
Colina Santamaria et al.

(10) Patent No.: US 8,780,325 B2
(45) Date of Patent: Jul. 15, 2014

(54) METHOD FOR A LITHOGRAPHIC APPARATUS

(75) Inventors: Luis Alberto Colina Santamaria, Veldhoven (NL); Jozef Maria Finders, Veldhoven (NL); Laurentius Cornelius De Winter, Vessem (NL)

(73) Assignee: ASML Netherlands B.V., Veldhoven (NL)

( * ) Notice: Subject to any disclaimer, the term of this patent is extended or adjusted under 35 U.S.C. 154(b) by 617 days.

(21) Appl. No.: 12/635,933

(22) Filed: Dec. 11, 2009

(65) Prior Publication Data

US 2010/0149508 A1    Jun. 17, 2010

Related U.S. Application Data

(60) Provisional application No. 61/193,677, filed on Dec. 15, 2008.

(51) Int. Cl.
*G03B 27/68* (2006.01)
*G03F 7/20* (2006.01)

(52) U.S. Cl.
CPC ........ *G03F 7/70308* (2013.01); *G03F 7/70833* (2013.01); *G03F 7/70891* (2013.01); *G03F 7/70266* (2013.01)
USPC .............................................. 355/52; 355/55

(58) Field of Classification Search
CPC ............ G03F 7/70266; G03F 7/70308; G03F 7/70833; G03F 7/70891; G03F 7/70283
USPC .................. 355/52, 55, 67, 71; 359/279, 649
See application file for complete search history.

(56) References Cited

U.S. PATENT DOCUMENTS

| 5,335,044 A * | 8/1994 | Shiraishi ........................ 355/53 |
| 6,245,470 B1 | 6/2001 | Kamon |
| 6,517,983 B2 | 2/2003 | Kamon |
| 6,970,291 B2 | 11/2005 | Kamon |

(Continued)

FOREIGN PATENT DOCUMENTS

| JP | 09-167731 | 6/1997 |
| JP | 2007-317847 A1 | 12/2007 |
| JP | 2008-118135 | 5/2008 |

OTHER PUBLICATIONS

Japanese Office Action mailed Nov. 30, 2011 in corresponding Japanese Patent Application No. 2009-278115.

(Continued)

*Primary Examiner* — Steven H Whitesell Gordon
(74) *Attorney, Agent, or Firm* — Pillsbury Winthrop Shaw Pittman LLP

(57) ABSTRACT

In an embodiment, there is provided a method of at least partially compensating for a deviation in a property of a pattern feature to be applied to a substrate using a lithographic apparatus. The method includes determining a desired phase change to be applied to at least a portion of a radiation beam that is to be used to apply the pattern feature to the substrate and which would at least partially compensate for the deviation in the property. The determination of the desired phase change includes determining a desired configuration of a phase modulation element. The method further includes implementing the desired phase change to the portion of the radiation beam when applying the pattern feature to the substrate, the implementation of the desired phase change comprising illuminating the phase modulation element with the portion of the radiation beam when the phase modulation element is in the desired configuration.

22 Claims, 4 Drawing Sheets

(56) References Cited

U.S. PATENT DOCUMENTS

| | | |
|---|---|---|
| 7,042,550 B2 | 5/2006 | Lowisch et al. |
| 7,170,682 B2 | 1/2007 | Kamon |
| 2004/0137677 A1 | 7/2004 | Lowisch et al. |
| 2005/0024612 A1* | 2/2005 | Hirukawa et al. ............... 355/55 |
| 2006/0092396 A1* | 5/2006 | Lipson et al. .................... 355/67 |
| 2006/0244940 A1* | 11/2006 | Uehara ............................ 355/69 |
| 2007/0296938 A1* | 12/2007 | Tel et al. ......................... 355/53 |
| 2008/0024874 A1* | 1/2008 | Uitterdijk et al. ............. 359/649 |
| 2008/0123066 A1 | 5/2008 | Jansen et al. |
| 2008/0273180 A1* | 11/2008 | Roux ............................... 355/30 |

OTHER PUBLICATIONS

Taiwan Office Action dated Feb. 26, 2013 in corresponding Taiwan Patent Application No. 098140697.

* cited by examiner

METHOD FOR A LITHOGRAPHIC APPARATUS

This application claims priority and benefit under 35 U.S.C. §119(e) to U.S. Provisional Patent Application No. 61/193,677, entitled "Method For A Lithographic Apparatus", filed on Dec. 15, 2008. The content of that application is incorporated herein in its entirety by reference.

FIELD

The present invention relates to a method of at least partially compensating for (e.g. reducing) a deviation in a property of a pattern feature to be applied to a substrate.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

When a pattern feature is applied to a substrate, the applied pattern feature is not always as intended. For example, a property of the pattern feature may deviate (i.e. deviate from an intended or desired property). The property could be, for example, a best focus of the pattern feature, a shape or size of the pattern feature, or a location of the pattern feature on the substrate. Taking the best focus of a pattern feature as an example, the best focus of different pattern features can be different due to, for example, a topography of a surface of the patterning device, a resist effect, or another effect that changes the angular distribution of amplitude/phase of radiation redirected by a pattern feature of a patterning device used to provide the pattern feature on the substrate.

One or more deviations in a property of a pattern feature applied to a substrate (from an intended or desired property, e.g. due to an error in the application of the pattern feature) can result in the construction of a device, of which the applied pattern feature is a part, that does not function as intended, or does not function at all. This is undesirable.

It is desirable to provide, for example, a method of at least partially compensating for a deviation in a property of a pattern feature to be applied to a substrate.

SUMMARY

According to an aspect, there is provided a method of at least partially compensating for a deviation in a property of a pattern feature to be applied to a substrate using a lithographic apparatus, the method comprising: obtaining information related to the deviation in the property of the pattern feature; determining a desired phase change to be applied to at least a portion of a radiation beam that is to be used to apply the pattern feature to the substrate and which would at least partially compensate for the deviation in the property, the determination of the desired phase change comprising determining a desired configuration of a phase modulation element; and implementing the desired phase change to the portion of the radiation beam when applying the pattern feature to the substrate to at least partially compensate for the deviation in the property, the implementation of the desired phase change comprising illuminating the phase modulation element with the at least a portion of the radiation beam when the phase modulation element is in the desired configuration.

Determining the configuration of the phase modulation element may comprise determining the configuration of a controllable region of the phase modulation element.

The determination of the desired phase change may comprise determining a sensitivity of a deviation in the pattern feature for a change in phase of the at least a portion of the radiation beam.

The determination of the desired phase change may comprise determining what change in phase would result in a deviation in the property of the pattern feature that is substantially equal and opposite to the deviation in the property.

Determining what change in phase would result in a deviation in the property of the pattern feature that is substantially equal and opposite to the deviation in the property may comprise determining the phase change contribution that is to be provided by each of a plurality of controllable regions of the phase modulation element; and/or determining the contribution provided by each of a plurality of controllable regions of the phase modulation element to the compensation for the deviation in property of the pattern feature.

Obtaining information related to the deviation in the property of the pattern feature may comprise: obtaining information using a model and/or obtaining information from a pattern feature previously applied to a substrate.

The property may be a best-focus for the pattern feature. Alternatively or additionally, the property may be a shape or size of the pattern feature (e.g. a distortion), and/or a displacement of the pattern feature.

The method may comprise at least partially compensating for a deviation in a property of at least two pattern features, or at least two types of pattern feature, to be applied to a substrate using a lithographic apparatus.

The deviation in the property of the pattern feature to be applied to the substrate using the lithographic apparatus may be a lithographic error (e.g. an error or imperfection caused by one or more elements of the lithographic process that results in a pattern feature being applied to the substrate which has one or more features that deviate from an intended or desired property).

The deviation is at least partially compensated for in that the deviation is reduced and/or minimized. The compensation may be such that the deviation is removed (e.g. reduced to zero). The pattern feature to be applied to a substrate may take any of a number of forms. For example, the pattern feature may be a pattern feature provided by a mask, reticle or other patterning device. The pattern feature to be applied to the substrate may be or comprise a portion of a radiation beam which in some way corresponds to a pattern feature provided by a patterning device. The pattern feature to be applied to the substrate may be an image of a pattern feature provided by a patterning device. The pattern feature to be applied to the substrate may be a feature that is to be provided in or on a layer of radiation sensitive material provided on the substrate. An embodiment of the present invention is able to at least partially compensate for one or more deviations in one or more properties of such pattern features that are to be applied to a substrate.

The phase modulation element may comprise one or more controllable regions that are controllable to change the phase of a portion of radiation incident on a controllable region. The one or more controllable regions may be controllable to change a refractive index of the one or more controllable regions. The one or more controllable regions may be controllable by selectively heating one or more controllable regions. The one or more controllable regions may be controllable by selectively controlling a shape, position or orientation of the one or more controllable regions.

The phase modulation element may be located at or adjacent to a pupil plane of the lithographic apparatus. The phase modulation element may be moveable. The phase modulation element may be moveable from a position at or adjacent to a pupil plane of the lithographic apparatus, to a position that is located away from a pupil plane of the lithographic apparatus.

According to an aspect, there is provided a lithographic apparatus comprising: a projection system configured to project a radiation beam onto a substrate; a phase modulation element configured to modulate the phase of at least a portion of the radiation beam and/or of a patterned beam of radiation from a patterning device; a determination arrangement configured to receive information related to a deviation in a property of a pattern feature to be applied to the substrate using a lithographic apparatus, the determination arrangement configured to determine a desired phase change to be applied to at least a portion of the radiation beam that is, in use, to be used to apply the pattern feature to the substrate and which would at least partially compensate for the deviation in the property; and a phase modulation element controller configured to control configuration of the phase modulation element to implement the desired phase change.

The lithographic apparatus may have, where appropriate, one or more of the features described above in relation to the method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
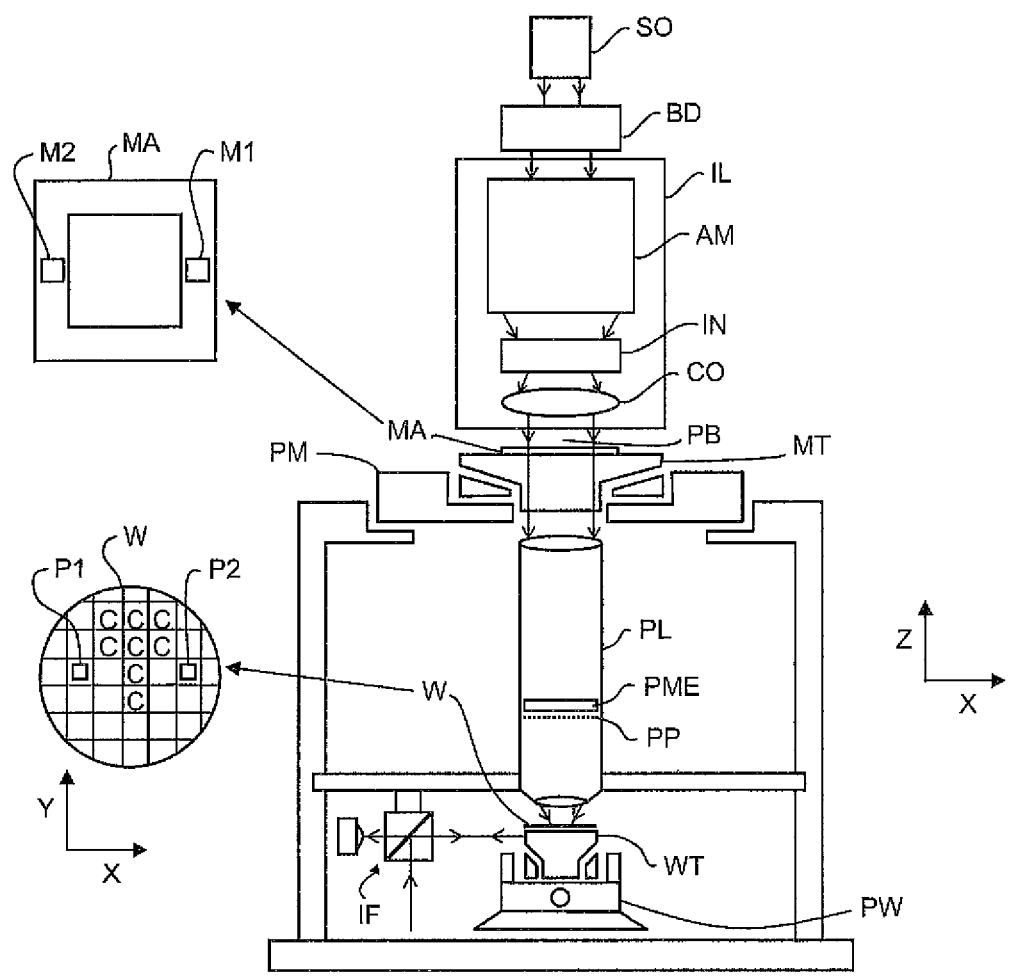
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as, for example, the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit. Any use of the terms "reticle" or "mask" herein may be considered synonymous with the more general term "patterning device".

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV radiation or EUV radiation);

a support structure (e.g. a support structure) MT to support a patterning device (e.g. a mask) MA and connected to first positioning device PM to accurately position the patterning device with respect to item PL;

a substrate table (e.g. a wafer table) WT to hold a substrate (e.g. a resist-coated wafer) W and connected to second positioning device PW to accurately position the substrate with respect to item PL;

a projection system (e.g. a refractive projection lens) PL configured to image a pattern imparted to the radiation beam PB by patterning device MA onto a target portion C (e.g. comprising one or more dies) of the substrate W; and a phase modulation element PME located in or adjacent to a pupil plane PP of the projection system PL, the phase modulation element PME being arranged to adjust a phase of at least a part of an electric field of the radiation beam.

As here depicted, the apparatus is of a transmissive type (e.g. employing a transmissive mask). Alternatively, the apparatus may be of a reflective type (e.g. employing a programmable mirror array of a type as referred to above).

A support structure MT holds the patterning device. It holds the patterning device in a way depending on the orientation of the patterning device, the design of the lithographic apparatus, and other conditions, such as for example whether or not the patterning device is held in a vacuum environment. The support structure can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to a projection system.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam (e.g. for providing a desired illumination made in the radiation beam). Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

An illumination system may also encompass various types of optical components, including refractive, reflective, and catadioptric optical components for directing, shaping, or controlling the beam of radiation, and such components may also be referred to below, collectively or singularly, as a "lens".

The radiation beam PB is incident on the patterning device (e.g. mask) MA, which is held on the support structure MT. Having traversed the patterning device MA, the beam PB passes through the projection system PL, which focuses the beam onto a target portion C of the substrate W. In passing through the projection system PL, the beam PB also passes via the phase modulation element PME. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As discussed above, when a pattern feature is applied to a substrate, the applied pattern feature is not always as intended (i.e. there may be an error in the application of the pattern feature to the substrate). A property of the pattern feature may deviate from an intended or desired property (i.e. an error may occur). The property could be, for example, a best focus of the pattern feature, a shape or size of the pattern feature, or a location of the pattern feature on the substrate. Taking the best focus of a pattern feature as an example, the best focus of different pattern features can be different due to, for example, a topography of a surface of the patterning device, a resist effect, or another effect that changes the angular distribution of amplitude/phase of the radiation redirected by a pattern feature of a patterning device used to provide the pattern feature on the substrate.

One or more deviations in a property of a pattern feature applied to a substrate (from an intended or desired property, e.g. due to an error in the application of the pattern feature) can result in the construction of a device, of which the applied pattern feature is a part, that does not function as intended, or does not function at all. This is undesirable.

It is therefore desirable to provide, for example, a method of at least partially compensating for a deviation in a property of a pattern feature, from an intended or desired property, to be applied to a substrate (e.g. to at least partially compensate for an error in the application or imaging of the pattern feature).

Figure 2:
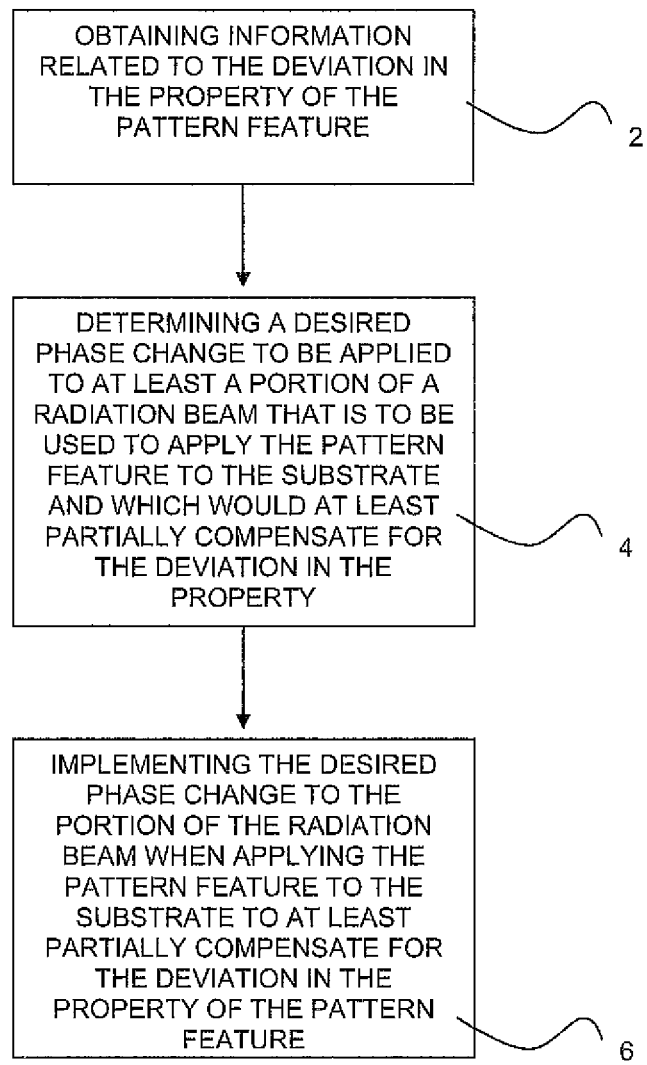
FIG. 2 is a flow chart schematically depicting a method of at least partially compensating for a deviation in a property of a pattern feature to be applied to a substrate in accordance with an embodiment of the present invention.

FIG. 2 is a flow chart that schematically depicts, in general, a method of at least partially compensating for a deviation in a property of a pattern feature, from an intended or desired property, to be applied to a substrate (e.g., to at least partially compensate for an error in the application or imaging of the pattern feature) according to an embodiment of the present invention.

A first part 2 of the method involves obtaining information related to a deviation in the property of the pattern feature. The deviation may, for example, relate to a best focus of the pattern feature, or be a deviation in shape or size of the pattern feature, or a deviation in the location (e.g. a displacement) of the pattern feature. The information related to the deviation in the property of the pattern feature may be obtained in any of a number of ways. In a first example, the information may be obtained by applying the pattern feature to a substrate, and then inspecting the applied pattern feature on the substrate. In a second example, the information may be obtained using a lithographic apparatus, and process model.

A second part 4 of the method involves determining a desired phase change to be applied to at least a portion of a radiation beam that is to be used to apply the pattern feature to the substrate and which would at least partially compensate for the deviation in the property. The determination involves determining a configuration of a phase modulation element (e.g. the phase modulation element shown in and described with reference to FIG. 1), for example a phase distribution (i.e. a phase transform distribution) provided by the phase modulation element. More specifically, the determination involves determining the configuration of one or more controllable regions of the phase modulation element. For example, the configuration may relate to the refractive index of one or more transmissive regions of the phase modulation element, or the orientations or positions of one or more reflective element of the phase modulation element, either or both of which may be used to control (i.e. modulation or transform) the phase of a portion of a radiation beam incident on the region (for example, relative to the phase of one or more other portions of the radiation beam). The determination of the configuration might involve determining the sensitivity of the deviation in the property of the pattern feature to a change in phase of at least a portion of the radiation beam caused by the respective configuration of one or more controllable regions of the phase modulation element. In general, the step of determining a desired phase change to be applied to at least a portion of a radiation beam that is to be used to apply the pattern feature to the substrate and which would at least partially compensate for the deviation in the property may comprise: determining what change in phase of the at least a portion of the radiation beam would result in a deviation in the property of the pattern feature that is substantially equal and opposite to the deviation in the property that is to be at least partially compensated for. This is because a deviation in the property of the pattern feature that is substantially equal and opposite to the deviation in the property that is to be at least partially compensated for will, by definition, substantially compensate for that deviation in the property.

A third part 6 of the method involves implementing the desired phase change to the at least a portion of the radiation beam when applying the pattern feature to the substrate to at least partially compensate for the deviation in the property of the pattern feature. The implementation comprises illuminating the phase modulation element with the at least a portion of the radiation beam that is to be used to apply the pattern feature to the substrate, when the phase modulation element is in the desired configuration.

The determination of the desired phase change to be applied to at least a portion of a radiation beam to at least partially compensate for the deviation in the property of the pattern feature may be undertaken by a determination arrangement, such as a computational arrangement or the like. The controlling of the phase modulation element to provide the desired phase change may be undertaken by a phase modulation element controller, such as for example a computational arrangement or the like. The determination arrangement and the phase modulation element controller may be, form or comprise the same piece of apparatus of equipment, for example the same computational arrangement.

The use of a phase modulation element provided with one or more controllable regions (e.g. transmissive or reflective regions) allows a desired phase distribution in the radiation beam to be established quickly and easily. For example, the phase modulation element does not need to be replaced each time a different phase distribution is required. Furthermore, a phase modulation element may be provided with a large number of controllable regions (e.g. 50 or more, or 100 or more), and this allows a phase distribution to be established with a high resolution. A high resolution phase distribution allows the method of at least partially compensating for a deviation in a property of a pattern feature, from an intended or desired property, to be applied to a substrate (e.g. to at least partially compensate for an error in the application of the pattern feature) to be implemented in a more accurate and/or flexible and/or consistent manner.

Described herein is a method of at least partially compensating for a deviation in a property of a pattern feature, from an intended or desired property, to be applied to a substrate. The deviation is at least partially compensated for in that the deviation is reduced and/or minimized. The compensation may be such that the deviation is removed (e.g. reduced to zero). The pattern feature to be applied to a substrate may take one of a number of forms. For example, the pattern feature may be a pattern feature provided by a mask, reticle or other patterning device. The pattern feature to be applied to the substrate may be or comprise one or more portions of a radiation beam which in some way correspond to a pattern feature provided by a patterning device. The pattern feature to be applied to the substrate may be an image of a pattern feature provided by a patterning device. The pattern feature to be applied to the substrate may be a feature that is to be provided in or on a layer of radiation sensitive material provided on the substrate. An embodiment of the present invention is able to at least partially compensate for one or more deviations in one or more properties of such pattern features that are to be applied to a substrate.

A specific embodiment of the present invention will now be described.

Different pattern features (e.g. pattern features of a different feature-type) may each have a different best focus. The difference in best focus may be, for example, due to the inherent difference in feature type of the pattern features. Alternatively or additionally, the difference in best focus may be due to astigmatism of the projection system or due to astigmatism induced by illumination of pattern features of patterning device (e.g., a topographic mask) with polarized radiation. Different pattern features having a different best focus may be generically described as k feature-types of a pattern having shifts of best-focus $BF_k$, (e.g. relative to a nominal focal plane or a substrate plane). For example, a set of two feature-types may include an array of dense line segments and spaces (a first feature-type), the line segments extending along a first direction (e.g. a y-axis), and a number of isolated lines (a second feature-type) extending along a second direction perpendicular to the first direction (e.g. an x-axis). The feature types could, of course, be other feature-types.

The shifts of best-focus $BF_k$ for k feature-types can be measured (i.e. obtained) experimentally by exposing the pattern with those feature-types at subsequent different substrate focus settings and inspecting the developed patterns in resist. Alternatively or additionally, the shifts of best-focus $BF_k$ for k feature-types can be calculated (i.e. obtained) using a lithographic apparatus and process model M.

Input data to the lithographic apparatus and process model M, and used for the calculation of the shifts of best-focus $BF_k$ may, for example, comprise: illumination mode information; lithographic apparatus settings; pattern data; projection system optical data (e.g. residual aberrations); resist data; and/or phase modulation element data.

In accordance with an embodiment of the invention, a method of at least partially compensating for a shift (i.e. a deviation) in best focus of two different feature types will now be described.

When the phase modulation element (e.g. the phase modulation element PME shown in and described with reference to FIG. 1) is in a neutral state (no phase change applied to traversing portions of a radiation beam) there are two best-focus shifts $BF_k$, with k=1, 2.

The phase modulation element has N controllable regions, each controllable region having a controllable optical phase setting $P_n$ with n=1, 2, . . . , N. The controllable regions are arranged in a two-dimensional matrix, but for simplicity may be numbered consecutively from 1 to N. A phase setting $P_n$ is expressed in nanometers (nm), where $P_n$ is a fraction $\Delta_n \lambda$ of the wavelength $\lambda$, of the exposure radiation, so that $P_n$ is equivalent to the phase $2\pi P_n/\lambda$ in radians.

The model M is used to determine sensitivities $S_{k,n}$, which may be qualitatively described as being the sensitivity of a deviation of best focus $BF_k$ to a change in a phase setting $P_n$, and quantitatively defined by the following derivative:

$$S_{k,n} = \left(\frac{\partial BF_k}{\partial P_n}\right)$$

Derivatives are taken at the value $P_i$=0, with i not equal to n.

It is assumed that to a good approximation that a best-focus shift contribution $BF_{k,n}$ due to application of a phase $P_n$ at pixel n can be predicted by:

$$BF_{k,n} = S_{k,n} P_n.$$

It is further assumed that to a good approximation different focus-shift contributions $BF_{k,n}$ add linearly to give the resulting (overall) best focus shift $BF_k$:

$$BF_k = \sum_{n=1}^{N} BF_{k,n} = \sum_{n=1}^{N} S_{k,n} P_n$$

Phase settings $P_n$ are determined which compensate for the best-focus shifts $BF_k$ (i.e. $BF_1$ and $BF_2$). Thus, a phase distribution is sought which would yield the equal and opposite best-focus shifts $-BF_1$ and $-BF_2$. To determine these phase settings $P_n$, the equation $$\begin{pmatrix} S_{1,1} & S_{1,2} & S_{1,3} & \ldots & S_{1,N} \\ S_{2,1} & S_{2,2} & S_{2,3} & \ldots & S_{2,N} \end{pmatrix} \begin{pmatrix} P_1 \\ P_2 \\ P_3 \\ \vdots \\ P_N \end{pmatrix} = \begin{pmatrix} -BF_1 \\ -BF_2 \end{pmatrix}$$

is solved by minimizing the norm of the difference between the obtained (e.g. through measurement or modeling) best focus and the desired best focus (i.e. by minimizing the shift of best focus). For example, the equation can be solved in least squares for the values $P_n$ (with n=1, 2, . . . , N) that provide an at least partial compensation of the best-focus shifts $BF_1$ and $BF_2$.

When these phase settings $P_n$ are determined, they may be implemented by controlling the N controllable regions of the phase modulation element to provide the determined phase settings. When the lithographic apparatus is then used to apply a pattern having the two different feature types to a substrate, a radiation beam (or a portion of the radiation beam) used to apply the pattern may traverse the phase modulation element when the phase modulation element is configured to provide the phase settings $P_n$. The phase settings $P_n$ of the phase modulation element compensate for best-focus shifts that would have been present in the applied pattern if such phase settings $P_n$ had not been provided.

When the deviation in the property to be at least partially compensated for (e.g. the error to be corrected) is field dependent, the phase modulation element may not be placed in the pupil plane of the projection system, but may instead be disposed along the optical axis (referred to as the z-axis) a distance away from the pupil plane. Then, radiation redirected at an off axis part (also called 'field points') of a pattern illuminated by a radiation beam will traverse different areas of the phase modulation element than radiation redirected at an on axis part of the phase modulation element. This enables phase manipulation to be undertaken for an off axis image formation independent of phase manipulation of an on axis image formation, and hence a compensation of both on axis error (i.e. a deviation in a property to be at least partially compensated for) and off axis error (i.e. a deviation in property to be at least partially compensated for). The phase modulation element may be moveable. The phase modulation element may be moveable from a position at or adjacent to a pupil plane of the lithographic apparatus, to a position that is located away from a pupil plane of the lithographic apparatus.

For example, if best-focus shifts were field dependent in the direction in which the second pattern feature type extends (i.e. along a second direction perpendicular to the first direction, e.g. along an x-axis), there may be, for example, three values of a best focus shift for the first pattern feature type $BF_1$ to be compensated: a right-off-axis value $BF_1$, −1, an on axis $BF_1$ value BF1, 0 and a left-off-axis $BF_1$ value, +1. Similarly three different best focus shifts for the second pattern feature type $BF_2$ may have to be compensated for. Such compensation leads to four additional sensitivity rows in the matrix equation given above (i.e. for the on and off axis contributions for each of the two feature types), and four additional best focus BF terms in the vector at the right (i.e. for the on and off axis contributions for each of the two feature types).

The method can also be used in presence of a subsidiary condition, for example a condition such as a maximum phase change that can be implemented by one or more regions of the phase modulation element.

As will be appreciated for the embodiments described above, a phase modulation element is needed. The phase modulation element may be configured so that certain parts of the phase modulation element are arranged to change the phase of certain parts of one or more components of a radiation beam incident upon (and/or passing through) the phase modulation element. The configuration may be actively controlled or be passively provided (e.g. pre-set) in the phase modulation element. The phase modulation may be undertaken by appropriate control of the configuration of, for example, a transmissive phase modulation element and/or of a reflective phase modulation element (e.g. a flexible reflective surface or a reflective surface comprising an array of moveable reflective facets or the like).

Figure 3:
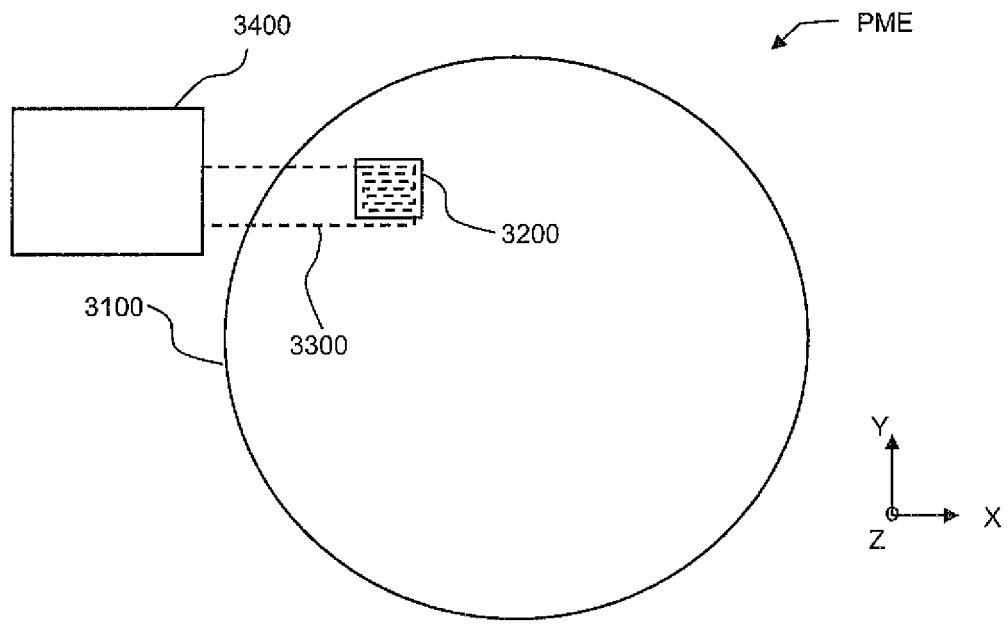
FIG. 3 schematically depicts a more detailed view of an embodiment of the phase modulation element shown in and/or described with reference to FIGS. 1 and 2.
Figure 4:
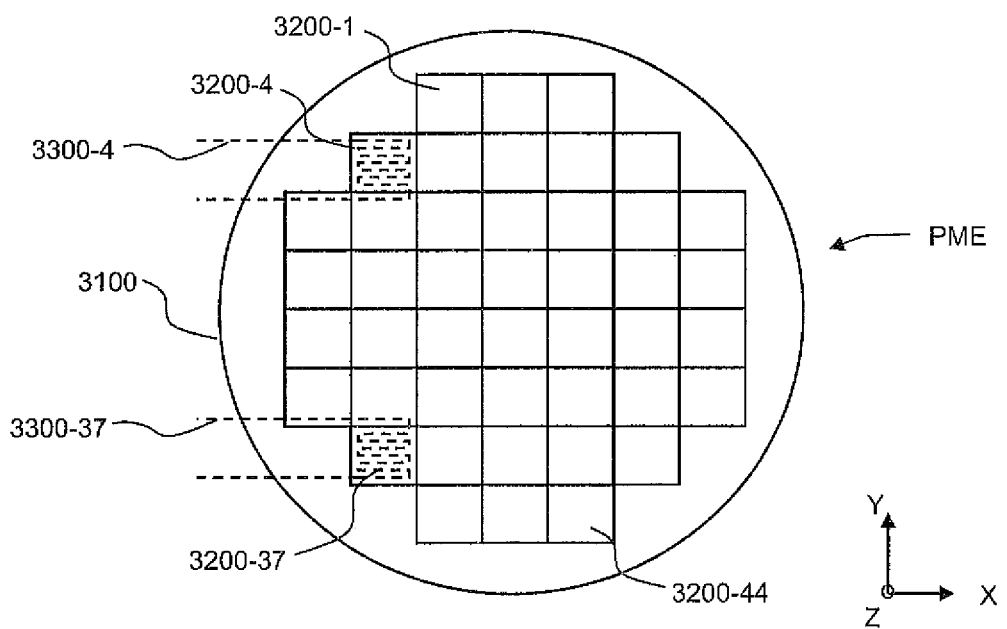
FIG. 4 schematically depicts further detail of the embodiment of the phase modulation element shown in and described with reference to FIG. 3.

FIGS. 3 and 4 schematically depict specific embodiments of an example suitable phase modulation element. FIG. 3 shows that the phase modulation element PME may comprise an optical element 3100 formed from material substantially transmissive for radiation constituting the radiation beam used in the lithographic apparatus. The phase modulation element may also comprise, or be in connection with, a controller 3400. An optical path length for a wave passing through the optical element 3100 is adjustable in response to a signal provided by the controller 3400. The optical element 3100 may be disposed, for example, in a Fourier transform plane (e.g. a pupil plane) of, for example, the projection system of the lithographic apparatus. Such a location would mean that, in use, the optical element 3100 is traversed by radiation (e.g. substantially diffracted and substantially non-diffracted) emanating from the patterning device. An adjustment (i.e. modulation) of a phase of a wave traversing the optical element 3100 may be achieved by applying heat to a region 3200 of the optical element 3100, thereby introducing a local change in the index of refraction of material constituting the optical element relative to the refractive index of material adjacent to and surrounding the region 3200. The application of heat may be achieved by, for example, transmitting an electrical current through a wire 3300 having Ohmic resistance and being arranged in contact with the region 3200 of the optical element 3300. The controller 3400 is arranged to provide the (correct level of) current to the wire 3300 to achieve a desired change in the refractive index of the region 3200 and therefore modulation of the phase of the wave passing through the region 3200.

A plurality of, for example, adjacent portions of the optical element 3100 may be provided with a corresponding plurality of wires for heating one, more, or all regions of the optical element 3100 independently from any other region. FIG. 4 schematically depicts an example of such an arrangement.

FIG. 4 shows the optical element 3100. Adjacent regions 3200-1 up to 3200-44 are disposed in adjacent rows and, in the Figure, from left to right and from top to bottom. Each region 3200 of the regions 3200-1 up to 3200-44 is provided with a corresponding heating wire 3300-1 up to 3300-44. FIG. 4 schematically depicts only a few of these heating wires 3300-1 up to 3300-44 for clarity, although it will be understood that heating wires would in practice be provided for each of the regions 3200-1 up to 3200-44.

The controller 3400 is constructed and arranged so that each wire 3300-1 up to 3300-44 can be current-activated independently. This enables application of a spatial phase distribution to one or more optical waves (e.g. components of a radiation beam) traversing the optical element 3100. As discussed above in relation to FIGS. 1 and 2 this spatial phase distribution may be used to manipulate specific portions of a radiation beam passing through the phase modulation element in order to, for example, at least partially compensate for a deviation in a property of a pattern feature to be applied to a substrate.

It will be appreciated that the phase modulation element may be formed from or comprise any suitable number of regions, and that the number is not necessarily limited to 44. The number of regions may, in general, depend on a desired special resolution of phase change that is desired in the lithographic apparatus. For example, a ratio of the area of each of the regions of the phase modulation element to the size of a clear area in the pupil plane may be between 100 and 1000.

Figure 5:
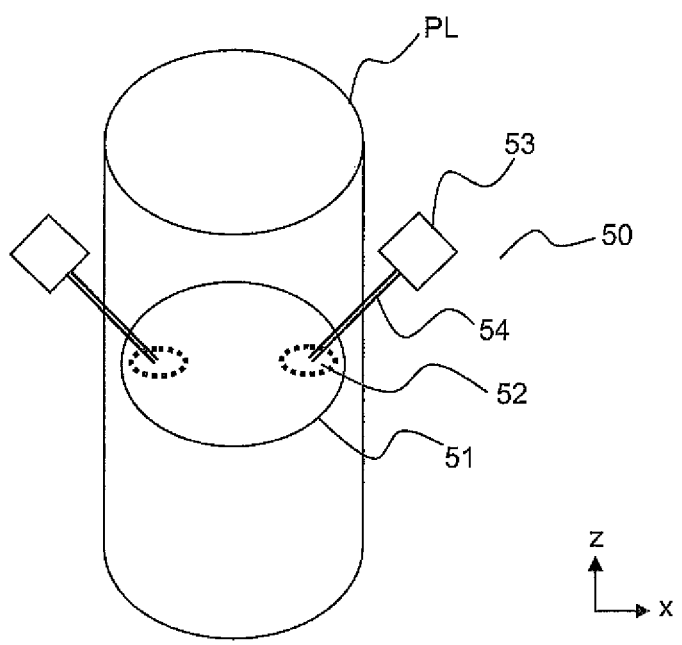
FIG. 5 schematically depicts a further embodiment of a phase modulation element shown in and/or described with reference to FIGS. 1 and 2.

FIG. 5 schematically depicts a further embodiment of an example suitable phase modulation element. FIG. 5 shows a projection system PL comprising an alternative phase adjuster 50. In this embodiment, the phase adjuster comprises at least one laser 53 arranged to selectively heat a portion 52 of an optical element 51 by emitting radiation 54 towards the portion of the optical element. The optical element may be disposed near a pupil plane of the projection system PL. The radiation may be infrared, UV or deep-UV radiation. The radiation may be guided to a selected portion of the optical element by means of, for example, one or more hollow optical fibers. Details of this embodiment can be gleaned from Japanese patent application publication no. JP 2007317847 A. In the absence of a cooling arrangement, temperatures of different portions can be arranged to mutually differ from each other by supplying corresponding mutually different amounts of radiation energy to the corresponding different portions. A nominal temperature may then be specified as, for example, the average temperature value of the mutually different temperatures.

It is noted that the invention is not limited to the specific embodiments of the phase adjuster described above. These embodiments are presented herein for illustrative purposes only. Additional embodiments will be apparent to persons skilled in the relevant art(s) based on the teachings contained herein.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

While specific embodiments of the invention have been described above, it will be appreciated that the invention may be practiced otherwise than as described. The description is not intended to limit the invention, the invention being limited by the claims that follow.

The invention claimed is:

1. A method of at least partially compensating for deviation in a property of a pattern feature to be applied to a substrate using a lithographic apparatus, the method comprising:
    obtaining information related to a deviation in an intended or desired value of a property of at least a first pattern feature of a pattern to be applied to a substrate using a lithographic apparatus, wherein an intended or desired value of the property of at least a second pattern feature of the pattern is different than that of at least the first pattern feature;
    determining a desired phase change to be applied to at least a portion of a patterned radiation beam that is to be used to apply at least the first pattern feature to the substrate, and which would at least partially compensate for the deviation in the property of at least the first pattern feature, the determination of the desired phase change comprising determining a desired configuration of a phase modulation element; and
    implementing the desired phase change to at least the portion of the patterned radiation beam when applying the pattern, comprising at least the first pattern feature and the second pattern feature, to the substrate to at least partially compensate for the deviation in the property of at least the first pattern feature while making substantially no change to the value of the property of at least the second feature or compensating for a deviation in the intended or desired value of the property of at least the second feature, the implementation of the desired phase change comprising illuminating the phase modulation element with the at least a portion of the patterned radiation beam when the phase modulation element is in the desired configuration.

2. The method of claim 1, wherein determining the desired configuration of the phase modulation element comprises determining the configuration of a controllable region of the phase modulation element.

3. The method of claim 1, wherein the determination of the desired phase change comprises determining what change in phase would result in a deviation in the property of at least the first pattern feature that is substantially equal and opposite to the deviation in the property of at least the first pattern feature.

4. The method of claim 3, wherein determining what change in phase would result in a deviation in the property of at least the first pattern feature that is substantially equal and opposite to the deviation in the property of at least the first pattern feature comprises:
    determining the phase change contribution that is to be provided by each of a plurality of controllable regions of the phase modulation element; and/or
    determining the contribution provided by each of a plurality of controllable regions of the phase modulation element to the compensation for the deviation in the property.

5. The method of claim 1, wherein obtaining information related to the deviation in the property of at least the first pattern feature comprises obtaining information using a model and/or obtaining information from a pattern feature previously applied to a substrate.

6. The method of claim 1, comprising at least partially compensating for the deviation in the property of at least the first pattern feature and of at least the second pattern feature.

7. The method of claim 1, wherein the deviation in the property of at least the first pattern feature to be applied to the substrate using the lithographic apparatus is a lithographic error.

8. The method of claim 1, wherein the property is a best-focus, a shape or size, and/or pattern feature displacement.

9. The method of claim 1, wherein the phase modulation element comprises a controllable region controllable to change the phase of a portion of radiation incident on the controllable region.

10. The method of claim 9, wherein the controllable region is controllable to change a refractive index of the controllable region by selectively heating the controllable region.

11. The method of claim 9, wherein the controllable region is controllable by selectively controlling a shape, position or orientation of the controllable region.

12. The method of claim 9, wherein the phase modulation element is located at or adjacent to a pupil plane of the lithographic apparatus.

13. The method of claim 1, wherein the phase modulation element is moveable from a position at or adjacent to a pupil plane of the lithographic apparatus, to a position that is located in the path of the radiation beam but away from a pupil plane of the lithographic apparatus.

14. The method of claim 1, wherein at least the first pattern feature is selected from the group comprising:
    a pattern feature provided by a patterning device;
    a portion of a radiation beam which relates to a pattern feature provided by a patterning device;
    an image of a pattern feature provided by a patterning device; or
    a pattern feature that is to be provided in or on a layer of radiation sensitive material provided on the substrate.

15. The method of claim 1, wherein determining the desired phase change to be applied to at least the portion of the patterned radiation beam that is to be used to apply the at least first pattern feature to the substrate is based on data in respect of at least the first pattern feature and in respect of at least the second pattern feature or a further pattern feature type.

16. A lithographic apparatus comprising:
    a projection system configured to project a patterned radiation beam onto a substrate;
    a phase modulation element configured to modulate the phase of at least a portion of the patterned beam of radiation from a patterning device;
    a determination arrangement configured to receive information related to a deviation in an intended or desired value of a property of at least a first pattern feature of a pattern to be applied to the substrate using a lithographic apparatus, wherein an intended or desired value of the property of at least a second pattern feature of the pattern is different than that of at least the first pattern feature, the determination arrangement configured to determine a desired phase change to be applied to at least a portion of the patterned radiation beam that is, in use, to be used to apply at least the first pattern feature to the substrate, and which would at least partially compensate for the deviation in the property of at least the first pattern feature; and a phase modulation element controller configured to control configuration of the phase modulation element to implement the desired phase change to at least the portion of the patterned radiation beam when applying the pattern, comprising at least the first pattern feature and the second pattern feature, to the substrate to at least partially compensate for the deviation in the property of at least the first pattern feature while making substantially no change to the value of the property of at least the second feature or compensating for a deviation in the intended or desired value of the property of at least the second feature.

17. The apparatus of claim 16, wherein the determination arrangement is configured to at least partially compensate for the deviation in the property of at least the first pattern feature and of at least the second pattern feature.

18. The apparatus of claim 16, wherein at least the first pattern feature comprises a dense array of spaced-apart features generally extending along a first direction or an isolated feature generally extending along a second direction substantially perpendicular to the first direction and at least the second pattern feature comprises the other of the dense array or isolated feature.

19. The apparatus of claim 16, wherein the property is a shape or size, and/or pattern feature displacement.

20. The apparatus of claim 16, wherein the phase modulation element is moveable from a position at or adjacent to a pupil plane of the lithographic apparatus, to a position that is located in the path of the radiation beam but away from a pupil plane of the lithographic apparatus.

21. The apparatus of claim 16, wherein the determination arrangement is further configured to determine the desired phase change to be applied to at least the portion of the patterned radiation beam that is, in use, to be used to apply at least the first pattern feature to the substrate based on data in respect of at least the first pattern feature and in respect of at least the second pattern feature or a further pattern feature type.

22. A lithographic apparatus comprising:
a projection system configured to project a radiation beam onto a substrate;
a phase modulation element configured to modulate the phase of at least a portion of the radiation beam and/or of a patterned beam of radiation from a patterning device, and configured to move from a position at or adjacent to a pupil plane of the lithographic apparatus, to a position that is located in the path of the radiation beam but away from a pupil plane of the lithographic apparatus;
a determination arrangement configured to receive information related to a deviation in a property of a pattern feature to be applied to the substrate using a lithographic apparatus, the determination arrangement configured to determine a desired phase change to be applied to at least a portion of the radiation beam that is, in use, to be used to apply the pattern feature to the substrate and which would at least partially compensate for the deviation in the property; and
a phase modulation element controller configured to control configuration of the phase modulation element to implement the desired phase change.

* * * * *